(12) United States Patent
Iwasaki

(10) Patent No.: US 8,742,454 B2
(45) Date of Patent: Jun. 3, 2014

(54) SEMICONDUCTOR DEVICE

(71) Applicant: Shinya Iwasaki, Toyota (JP)

(72) Inventor: Shinya Iwasaki, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 13/738,292

(22) Filed: Jan. 10, 2013

(65) Prior Publication Data
US 2013/0181254 A1    Jul. 18, 2013

(30) Foreign Application Priority Data
Jan. 16, 2012  (JP) .................. 2012-006487

(51) Int. Cl.
H01L 27/06    (2006.01)

(52) U.S. Cl.
USPC ........................................ 257/140

(58) Field of Classification Search
CPC .............. H01L 29/66333; H01L 2924/13055; H01L 27/14687; H01L 29/401; H01L 29/45; H02H 9/044

USPC ...................... 257/140, 337, E27.03, E27.31, 257/E27.037, E27.038, E27.039
See application file for complete search history.

(56) References Cited

U.S. PATENT DOCUMENTS
2009/0278166 A1    11/2009  Soeno et al.

FOREIGN PATENT DOCUMENTS
JP    2009124049 A  *  6/2009
JP    A-2009-272550      11/2009

OTHER PUBLICATIONS
Machine translation of JP 2009124049 A.*

* cited by examiner

Primary Examiner — Matthew Reames
Assistant Examiner — Vincent Wall
(74) Attorney, Agent, or Firm — Oliff PLC

(57) ABSTRACT

In a semiconductor device having a semiconductor substrate on which a diode and an IGBT are formed, a cathode region of the diode and a collector region of the IGBT are formed in a range exposed to one surface of the semiconductor substrate. On the surface, a first conductor layer that is in contact with the cathode region, and a second conductor layer that is in contact with the collector region are formed. The work function of the second conductor layer is larger than the work function of the first conductor layer.

4 Claims, 6 Drawing Sheets

SEMICONDUCTOR DEVICE

INCORPORATION BY REFERENCE

The disclosure of Japanese Patent Application No. 2012-006487 filed on Jan. 16, 2012 including the specification, drawings and abstract is incorporated herein by reference in its entirety.

BACKGROUND OF THE INVENTION

1. Field of the Invention

The art disclosed by the present specification relates to a semiconductor device having a semiconductor substrate on which a diode and an IGBT are formed.

2. Description of Related Art

In Japanese Patent Application Publication No. 2009-272550 (JP-2009-272550 A), there is disclosed a semiconductor device having a semiconductor substrate on which a diode and an IGBT are formed. In general, such a semiconductor device is called an RC-IGBT. In this RC-IGBT, a cathode region of the diode and a collector region of the IGBT are formed in a range exposed to a lower face of the semiconductor substrate. Besides, a common electrode that conducts to the cathode region and the collector region are formed on the lower face of the semiconductor substrate.

In a conventional RC-IGBT having a common electrode that conducts to a cathode region and a collector region as in Japanese Patent Application Publication No. 2009-272550 (JP-2009-272550 A), a metal having a relatively large work function, such as AlSi or the like, is used for the common electrode. The metal having the large work function has a low barrier for a p-type collector region. Accordingly, the common electrode suitably conducts to the collector region. On the other hand, the metal having the large work function has a high barrier for an n-type cathode region. Thus, in the conventional RC-IGBT, with a view to making the common electrode conduct to the cathode region, an extremely high concentration of an n-type impurity is infused into the cathode region. When the high concentration of the n-type impurity is thus infused into the semiconductor substrate, amorphized defects are formed in the semiconductor substrate. Such defects are unfavorable because they cause the leakage of electric current. By laser-annealing the semiconductor substrate, such defects can be removed to a certain degree. However, it is difficult to completely remove the defects. In particular, in a region where the concentration of the n-type impurity is high, laser light is likely to be absorbed. Thus, laser light does not reach a deep position of the semiconductor substrate, and it is extremely difficult to remove defects that are present at a deep position.

SUMMARY OF THE INVENTION

The invention provides a semiconductor device having a semiconductor substrate on which a diode and an IGBT are formed, with a relatively low concentration of an n-type impurity in a cathode region.

A first aspect of the invention relates to a semiconductor device having a semiconductor substrate on which a diode and an IGBT are formed. In this semiconductor device, a cathode region of the diode and a collector region of the IGBT are formed on one surface of the semiconductor substrate. On the surface, a first conductor layer that is in contact with the cathode region, and a second conductor layer that is in contact with the collector region are formed. A work function of the second conductor layer is larger than a work function of the first conductor layer.

In this semiconductor device, the first conductor layer is in contact with the cathode region. Since the work function of the first conductor layer is small, a barrier between the first conductor layer and the cathode region is small. That is, in this semiconductor device, even when the concentration of an n-type impurity in the cathode region is relatively low, the barrier between the first conductor layer and the cathode region is small. Since there is no need to infuse a high concentration of the n-type impurity into the cathode region, the aforementioned problem of defects does not arise. Besides, in this semiconductor device, the second conductor layer is in contact with the collector region. Since the work function of the second conductor layer is large, a barrier between the second conductor layer and the collector region is small. In this manner, in this semiconductor device, even when the concentration of the impurity in one of the cathode layer and the collector layer is not made very high, both the cathode region and the collector region are connected to the conductor layers by the low barriers respectively.

Besides, the position of the boundary between the cathode region and the collector region varies depending on the amount of the impurity infused into the cathode region and the collector region, the diffusion length of the impurity in an impurity activation process following infusion, or the like. Thus, when semiconductor devices are mass-produced, the position of the boundary between the cathode region and the collector region disperses among the semiconductor devices. In particular, in the case where the impurity activation process is carried out through laser annealing, the range of heating (the range of laser radiation) is narrower than the surface of the semiconductor substrate. Therefore, the surface needs to be laser-annealed a plurality of times. Thus, part of the surface of the semiconductor substrate has a region that is laser-annealed a plurality of times, and the diffusion length of the impurity is long in that region. Thus, the position of the aforementioned boundary more greatly disperses. When the area of contact between the second conductor layer and the collector region varies due to the dispersion of the position of this boundary, the amount of holes delivered into the semiconductor substrate via the collector region varies, and the characteristic of the IGBT greatly varies. Thus, the dispersion of the characteristic of the IGBT increases.

Accordingly, in the aforementioned semiconductor device, it is preferable that the cathode region be adjacent to the collector region in the range exposed to the surface. Besides, it is preferable that the first conductor layer be adjacent to the second conductor layer. Besides, it is preferable that a boundary between the cathode region and the collector region (hereinafter referred to as a first boundary) be arranged closer to the cathode region side than a boundary between the first conductor layer and the second conductor layer (hereinafter referred to as a second boundary).

In this configuration, the first boundary is arranged closer to the first conductor layer side than the second boundary. Therefore, even when the position of the first boundary varies, the area of contact between the second conductor layer and the collector region does not vary. Besides, the first conductor layer and the collector region are in contact with each other in a region between the first conductor layer and the second boundary. The area of the region where this first conductor layer and this collector region are in contact with each other varies depending on the position of the first boundary. However, since the barrier between a first electrode and the collector region is large, there are hardly any holes that are supplied to the semiconductor substrate through the region where this first electrode and this collector region are in contact with each other. Thus, the area of the region where the first electrode and the collector region are in contact with each other hardly influences the characteristic of the IGBT. Accordingly, in the semiconductor device of this configuration, even when the position of the first boundary disperses, the characteristic of the IGBT hardly disperses.

BRIEF DESCRIPTION OF THE DRAWINGS

Features, advantages, and technical and industrial significance of an exemplary embodiment of the invention will be described below with reference to the accompanying drawings, in which like numerals denote like elements, and wherein.

DETAILED DESCRIPTION OF EMBODIMENT

Figure 1:
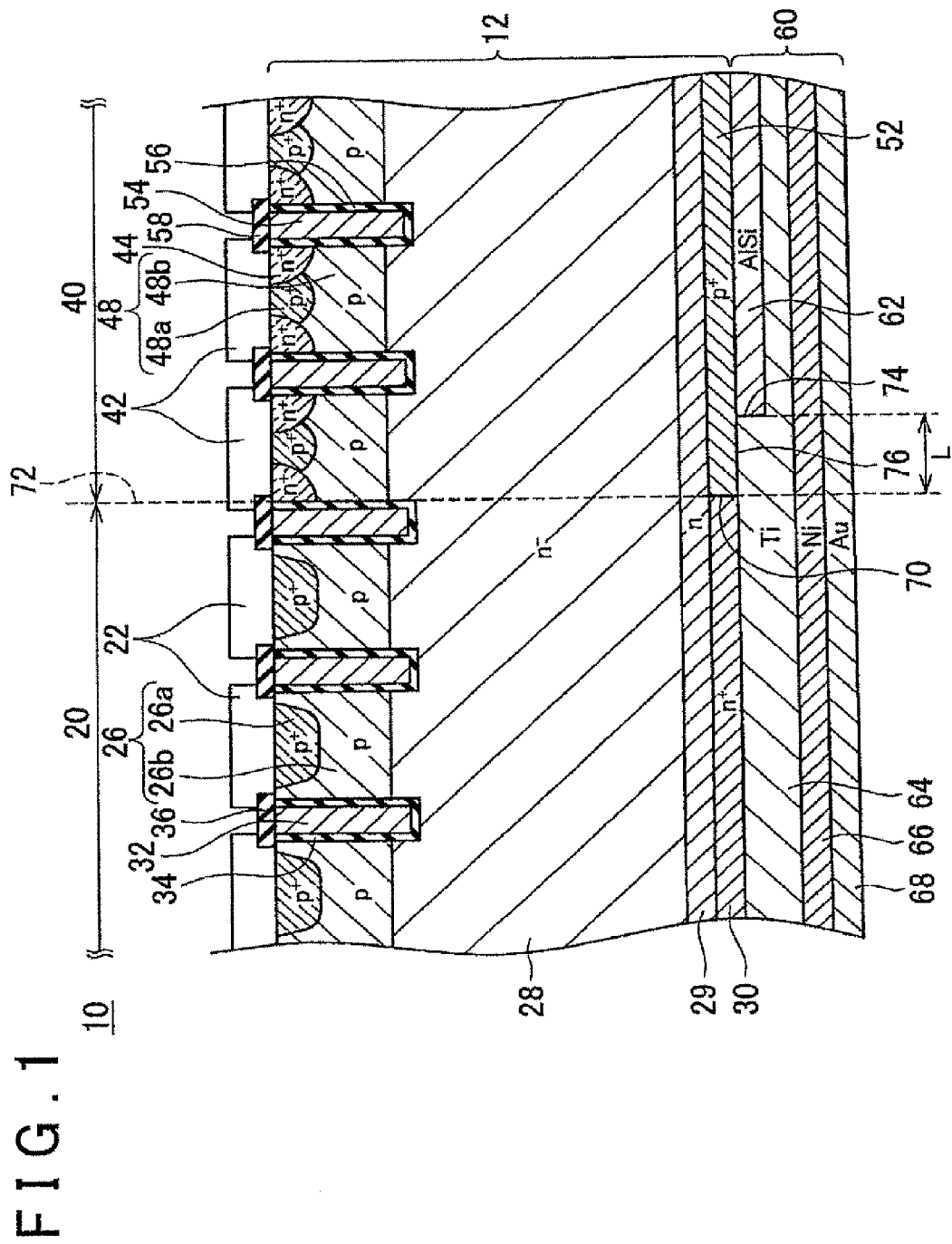
FIG. 1 is a longitudinal sectional view of an RC-IGBT 10.

As shown in FIG. 1, an RC-IGBT 10 of the embodiment of the invention is equipped with a semiconductor substrate 12 that is made of silicon, and electrodes (conductor layers), insulating layers, and the like, which are formed on an upper face and a lower face of the semiconductor substrate 12. A diode region 20 and an IGBT region 40 are formed on the semiconductor substrate 12.

Anode electrodes 22 are formed on the upper face of the semiconductor substrate 12 in the diode region 20. Emitter electrodes 42 are formed on the upper face of the semiconductor substrate 12 in the IGBT region 40. A common electrode 60 is formed on the lower face of the semiconductor substrate 12.

Anode regions 26, a drift layer 28, a buffer layer 29, a cathode layer 30, and trench electrodes 32 are formed in the diode region 20.

A plurality of trenches are formed in the upper face of the semiconductor substrate 12 in the diode region 20. Inner faces of the respective trenches are covered with insulating films 34. Besides, the trench electrodes 32 are formed inside the trenches respectively. Upper faces of the trench electrodes 32 are covered with insulating films 36 respectively. The trench electrodes 32 are insulated from the anode electrodes 22 by the insulating films 36 respectively.

Each of the anode regions 26 is a p-type semiconductor. Each of the anode regions 26 is equipped with a corresponding one of high-concentration anode regions 26a and a corresponding one of low-concentration anode regions 26b. Each of the high-concentration anode regions 26a is formed in the shape of an island in a range exposed to the upper face of the semiconductor substrate 12. The high-concentration anode regions 26a contain a high concentration of a p-type impurity. Each of the high-concentration anode regions 26a is ohmically connected to a corresponding one of the anode electrodes 22. Each of the low-concentration anode regions 26b is formed below and beside a corresponding one of the high-concentration anode regions 26a. The concentration of the p-type impurity in the low-concentration anode regions 26b is lower than the concentration of the p-type impurity in the high-concentration anode regions 26a.

A drift layer 28 is formed below the anode regions 26. The drift layer 28 is an n-type semiconductor, and contains a low concentration of an n-type impurity.

A buffer layer 29 is formed below the drift layer 28 in the diode region 20. The buffer layer 29 is an n-type semiconductor. The concentration of the n-type impurity in the buffer layer 29 is higher than the concentration of the n-type impurity in the drift layer 28.

A cathode layer 30 is formed below the buffer layer 29. The cathode layer 30 is formed in a range exposed to the lower face of the semiconductor substrate 12. The cathode layer 30 is an n-type semiconductor, and contains a high concentration of the n-type impurity. However, the concentration of the n-type impurity in the cathode layer 30 is lower than the concentration of the n-type impurity in a cathode layer of a conventional RC-IGBT. The concentration of the n-type impurity on the lower face of the cathode layer 30 is about $1 \times 10^{19}$ atoms/cm$^3$. The cathode layer 30 is ohmically connected to the common electrode 60.

In the diode region 20, a diode is formed by the anode regions 26, the drift layer 28, the buffer layer 29, and the cathode layer 30.

In the IGBT region 40, emitter regions 44, body regions 48, the drift layer 28, the buffer layer 29, a collector layer 52, and gate electrodes 54 are formed.

A plurality of trenches are formed in the upper face of the semiconductor substrate 12 in the IGBT region 40. An inner face of each of the trenches is covered with a corresponding one of gate insulating films 56. In each of the trenches, a corresponding one of the gate electrodes 54 is formed. An upper face of each of the gate electrodes 54 is covered with a corresponding one of insulating films 58. Each of the gate electrodes 54 is insulated from a corresponding one of the emitter electrodes 42 by a corresponding one of the insulating films 58.

Each of the emitter regions 44 is formed in the shape of an island in a range exposed to the upper face of the semiconductor substrate 12. Each of the emitter regions 44 is formed in such a range as to be in contact with a corresponding one of the gate insulating films 56. Each of the emitter regions 44 is an n-type semiconductor, and contains a high concentration of impurity. Each of the emitter regions 44 is ohmically connected to a corresponding one of the emitter electrodes 42.

Each of the body regions 48 is a p-type semiconductor. Each of the body regions 48 is equipped with a corresponding one of high-concentration body regions 48a and a corresponding one of low-concentration body regions 48b. Each of the high-concentration body regions 48a is formed in the shape of an island in a range exposed to the upper face of the semiconductor substrate 12. Each of the high-concentration body regions 48a is formed between two corresponding ones of the emitter regions 44. The high-concentration body regions 48a contain a high concentration of impurity. Each of the high-concentration body regions 48a is ohmically connected to a corresponding one of the emitter electrodes 42. Each of the low-concentration body regions 48b is formed below a corresponding one of the emitter regions 44 and a corresponding one of the high-concentration body regions 48a. Each of the low-concentration body regions 48b is formed in a range shallower than a lower end of a corresponding one of the gate electrodes 54. The concentration of impurity in the low-concentration body regions 48b is lower than the concentration of impurity in the high-concentration body regions 48a. Each of the emitter regions 44 is separated from the drift layer 28 by a corresponding one of the low-concentration body regions 48b. Each of the gate electrodes 54 faces a corresponding one of the low-concentration body regions 48b in a range where the emitter regions 44 are separated from the drift layer 28, via a corresponding one of the gate insulating films 56.

The drift layer 28 is formed below the body regions 48. That is, the drift layer 28 is formed across between the diode region 20 and the IGBT region 40.

The buffer layer 29 is formed below the drift layer 28 in the IGBT region 40. That is, the buffer layer 29 is formed across between the diode region 20 and the IGBT region 40.

The collector layer 52 is formed below the buffer layer 29 in the IGBT region 40. The collector layer 52 is formed in a range exposed to the lower face of the semiconductor substrate 12. The collector layer 52 is a p-type semiconductor, and contains a high concentration of impurity. The concentration of the p-type impurity on the lower face of the collector layer 52 is about $1 \times 10^{18}$ atoms/cm$^3$. The collector layer 52 is ohmically connected to the common electrode 60. The collector layer 52 is adjacent to the cathode layer 30. When viewed at right angles to the upper face of the semiconductor substrate 12, a boundary 70 between the collector layer 52 and the cathode layer 30 substantially coincides with a boundary 72 between the diode region 20 and the IGBT region 40 (a boundary between a region where the anode regions 26 are formed and a region where the emitter regions 44 and the body regions 48 are formed, on the upper face side of the semiconductor substrate 12).

In the IGBT region 40, an IGBT is formed by the emitter regions 44, the body regions 48, the drift layer 28, the buffer layer 29, the collector layer 52, and the gate electrodes 54.

Next, the structure of the common electrode 60 will be described in more detail. An AlSi layer 62 formed of AlSi (aluminum-silicon alloy) and a Ti layer 64 formed of Ti (titanium) are formed at positions that are in contact with the lower face of the semiconductor substrate 12. The AlSi layer 62 and the Ti layer 64 are adjacent to each other. The Ti layer 64 is formed in contact with the entire region of the lower face of the cathode layer 30. The AlSi layer 62 is formed in contact with the substantially entire range of the lower face of the collector layer 52. However, the Ti layer 64 is in contact with the lower face of the collector layer 52 that is located within a distance L from the boundary 70. That is, the Ti layer 64 extends to the lower side of the collector layer 52 beyond the boundary 70. Thus, when viewed at right angles to the upper face of the semiconductor substrate 12, the boundary 70 between the cathode layer 30 and the collector layer 52 is arranged closer to the cathode layer 30 side than the boundary 74 between the AlSi layer 62 and the Ti layer 64. The boundary 74 extends parallel to the boundary 70 (in this case, the boundary 74 does not include a boundary between the Ti layer 64 and the lower face of the AlSi layer 62). Besides, the Ti layer 64 is formed below the AlSi layer 62 as well. A Ni layer 66 formed of Ni (nickel) is formed below the Ti layer 64. An Au layer 68 formed of Au (gold) is formed below the Ni layer 66 (the most surface layer). Incidentally, the aforementioned distance L varies depending on the dispersion of the position of the boundary 70, but preferably ranges from about 0.5 μm to about 20 μm.

AlSi has a work function as high as about 5.0 eV (with a barrier height of 0.3 to 0.4 eV). Thus, even when the concentration of the p-type impurity in the collector layer 52 is not very high, the barrier between the AlSi layer 62 and the collector layer 52 is small. Besides, Ti has a work function as low as about 4.33 eV (with a barrier height of about 0.6 eV). Thus, even when the concentration of the n-type impurity in the cathode layer 30 is not very high, the barrier between the Ti layer 64 and the cathode layer 30 is small. In this manner, by using AlSi, which has the large work function, for a conductor layer that is in contact with the collector layer 52, and Ti, which has the small work function, for a conductor layer that is in contact with the cathode layer 30, the common electrode 60 that suitably conducts to both the collector layer 52 and the cathode layer 30 is obtained even when the concentrations of impurity in the collector layer 52 and the cathode layer 30 are not made very high.

Besides, when viewed at tight angles to the upper face of the semiconductor substrate 12, a contact region 76 of the Ti layer 64 and the collector layer 52 is formed in a region between the boundary 70 and the boundary 74. The work function of Ti is small, and the collector layer 52 is a p-type semiconductor. Therefore, there is a high barrier in the contact region 76. Thus, almost no electric current flows via the contact region 76, between the collector layer 52 and the common electrode 60. Since almost no electric current flows through the contact region 76, the range where the collector layer 52 and the common electrode 60 substantially conduct to each other is a range where the collector layer 52 and the AlSi layer 62 are in contact with each other.

In the case where RC-IGBT's 10 are mass-produced, the position of the boundary 70 between the collector layer 52 and the cathode layer 30 (a lateral position in FIG. 1) greatly disperses among the manufactured RC-IGBT's 10, due to the influence of manufacturing conditions. When the position of the boundary 70 varies, the area of the contact region 76 varies. However, as described above, almost no electric current flows through the contact region 76. Therefore, even when the area of the contact region 76 varies, the characteristic of the RC-IGBT 10 is hardly influenced. As described above, the range where the collector layer 52 and the common electrode 60 substantially conduct to each other is a range where the collector layer 52 and the AlSi layer 62 are in contact with each other. That is, when the area of contact between the collector layer 52 and the AlSi layer 62 varies, the amount of holes flowing into the IGBT region 40 varies, and the characteristic of the IGBT greatly varies. However, the boundary 70 and the boundary 74 are spaced apart from each other by the distance L. Therefore, even when the position of the boundary 70 varies, the area of contact between the collector layer 52 and the AlSi layer 62 does not vary. Accordingly, even when the position of the boundary 70 disperses in the case where the RC-IGBT's 10 are mass-produced, the characteristic of the IGBTs is unlikely to disperse among the mass-produced RC-IGBT's 10.

Incidentally, when the position of the boundary 70 varies in the RC-IGBT 10, the area of contact between the cathode layer 30 and the Ti layer 64 varies as well. However, even when this contact area varies, the characteristic of the diode does not vary very greatly. Accordingly, even when the position of the boundary 70 disperses in the case where the RC-IGBT's 10 are mass-produced, the characteristic of the diode does not disperse very greatly among the mass-produced RC-IGBT's 10.

Figure 2:
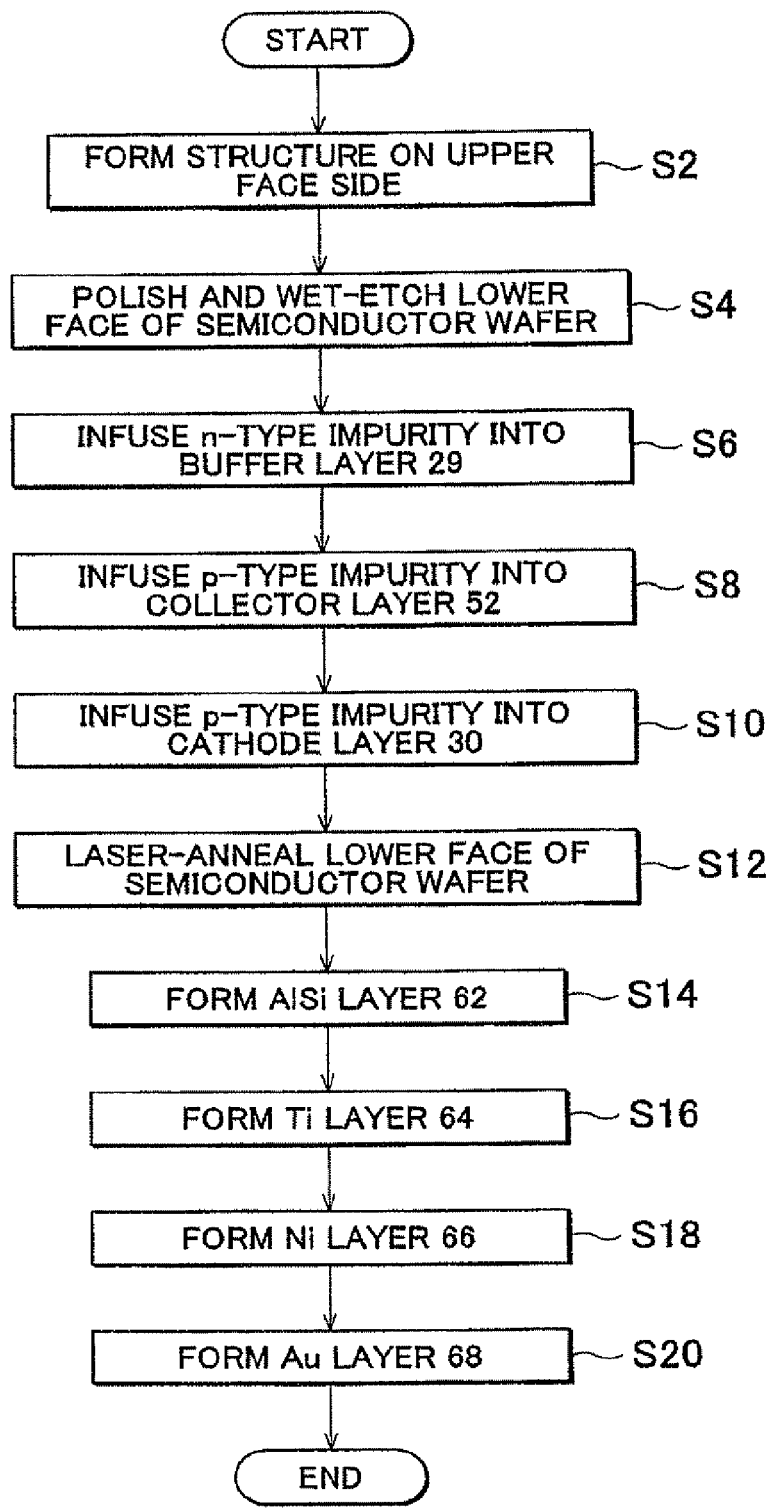
FIG. 2 is a flowchart showing processes of manufacturing the RC-IGBT 10.

Next, manufacturing processes of the RC-IGBT 10 will be described. The RC-IGBT 10 is manufactured from an n-type semiconductor wafer having substantially the same concentration of the n-type impurity as the drift layer 28. As indicated by step S2 of FIG. 2, first of all, the structure on the upper face side of the RC-IGBT 10 (i.e., the emitter regions 44, the body regions 48, the gate electrodes 54, the emitter electrodes 42, the anode regions 26, the trench electrodes 32, the anode electrodes 22, and the like) is formed. In step S4, the semiconductor wafer is thinned by polishing and wet-etching the lower face of the semiconductor wafer. Steps S2 and S4 are carried out according to a conventionally known method.

In step S6, the n-type impurity is infused into the entire lower face of the semiconductor wafer. In this step, the n-type impurity is infused to such a depth that mainly the buffer layer 29 is to be formed. Besides, in this step, the impurity is infused at a concentration lower than in later-described steps S8 and S10. In step S8, the p-type impurity is infused into the entire lower face of the semiconductor wafer. In this step, the p-type impurity is infused to a depth of the collector layer 52 (to an extremely shallow position). Besides, in this step, the p-type impurity is infused at a relatively low concentration. In step S10, the n-type impurity is infused into the lower face of the semiconductor wafer in a range where the cathode layer 30 is to be formed. In this step, the n-type impurity is infused at a higher concentration than the p-type impurity infused in step S8. However, in step S10, the n-type impurity is infused at a lower concentration than in the cathode layer of the conventional RC-IGBT. In this manner, ion infusion of steps S6 to S10 is carried out at a relatively low concentration. Thus, the number of crystal defects formed in the semiconductor wafer in steps S6 to S10 is small.

In step S12, laser light is radiated toward the lower face of the semiconductor wafer, whereby the lower face of the semiconductor wafer is heated (laser-annealed). Thus, the impurity infused into the semiconductor wafer is activated, and the buffer layer 29, the cathode layer 30, and the collector layer 52 are formed. Besides, in this case, the infused impurity is diffused. The diffusion length of the impurity at this moment greatly varies depending on manufacturing conditions (especially a laser annealing condition of step S12). Accordingly, the position of the boundary 70 between the cathode layer 30 and the collector layer 52 disperses relatively greatly. Besides, the defects in the semiconductor wafer disappear by laser annealing. Since the concentration of the impurity in the cathode layer 30 is relatively low, laser light reaches a relatively deep position of the semiconductor wafer through the cathode layer 30. Accordingly, the crystal defects formed at a deep position of the semiconductor wafer can also be vanished. Thus, the number of crystal defects remaining in the semiconductor wafer can be made smaller than in the conventional semiconductor wafer.

In step S14, AlSi is grown on the lower face of the collector layer 52 through sputtering whose range is limited by a mask or the like. Thus, the AlSi layer 62 is formed. However, in this case, the AlSi layer 62 is not formed on the lower face of the collector layer 52 in the vicinity of the boundary 70. That is, the position where the AlSi layer 62 is formed is set such that an end of the AlSi layer 62 (an end equivalent to the boundary 74 in FIG. 1) is located closer to the collector layer 52 side than the boundary 70 even in the case where the boundary 70 is located closest to the collector layer 52 side within the scope of a manufacturing tolerance.

Incidentally, in the conventional RC-IGBT, the AlSi layer is formed on the entire lower face of the semiconductor wafer including the lower face of the cathode layer. In this case, however, part of Al is diffused into the cathode layer. In the semiconductor layer, Al functions as a p-type impurity. Therefore, in the conventional RC-IGBT, a high concentration of the n-type impurity needs to be infused into the cathode layer to eliminate the influence of the diffused Al. However, in this embodiment of the invention, the AlSi layer 62 is not formed on the lower face of the cathode layer 30. Therefore, Al is not diffused into the cathode layer 30. Accordingly, no problem arises even when the concentration of the n-type impurity in the cathode layer 30 is low.

In step S16, the Ti layer 64 is formed on the entire lower face of the semiconductor wafer. Thus, the Ti layer 64 that is in contact with the collector layer 52 in the vicinity of the boundary 70 and the cathode layer 30 is formed. Besides, the Ti layer 64 is formed below the AlSi layer 62 as well.

In step S18, the Ni layer 66 is formed below the Ti layer 64. In step S20, the Au layer 68 is formed below the Ni layer 66. The RC-IGBT 10 shown in FIG. 1 is manufactured by the foregoing steps.

As described above, the RC-IGBT 10 of the embodiment of the invention makes it possible to hold the concentration of the n-type impurity in the cathode layer 30 relatively low. Thus, the number of crystal defects in the semiconductor substrate 12 is small. Accordingly, the amount of electric current leaking from the RC-IGBT 10 is small. Besides, even when the position of the boundary 70 varies, the area of contact between the collector layer 52 and the AlSi layer 62 does not vary. Accordingly, even when the position of the boundary 70 disperses among the mass-produced RC-IGBT's 10, the characteristic is unlikely to disperse among the RC-IGBTs 10. Thus, the RC-IGBTs 10 can be mass-produced with stable quality.

In the foregoing embodiment of the invention, in step S14, the AlSi layer 62 is formed through sputtering whose range is limited by a mask or the like. However, the AlSi layer 62 may be formed on the entire lower face of the semiconductor wafer, and then, an unnecessary portion of the AlSi layer 62 (the AlSi layer 62 on the lower face of the cathode layer 30 and within the distance L) may be removed through etching.

Incidentally, in the foregoing embodiment of the invention, the Ni layer and the Au layer are formed below the Ti layer. However, an AlSi layer, an Ni layer, and an Au layer may be stacked in this order below the Ti layer. Besides, an AlSi layer, a Ti layer, an Ni layer, and an Au layer may be stacked in this order below the Ti layer.

Figure 3:
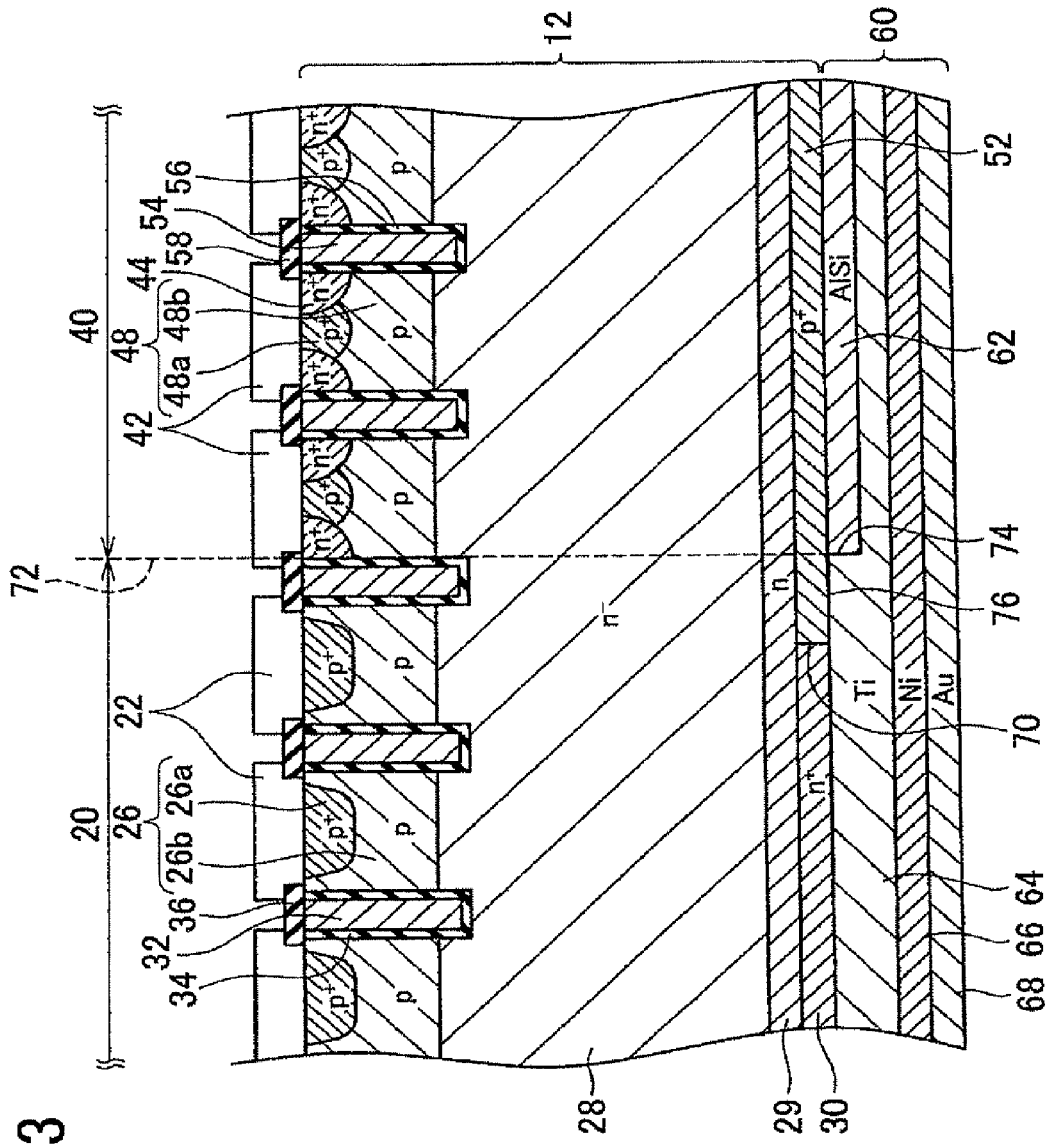
FIG. 3 is a longitudinal sectional view of an RC-IGBT of a modification example.
Figure 4:
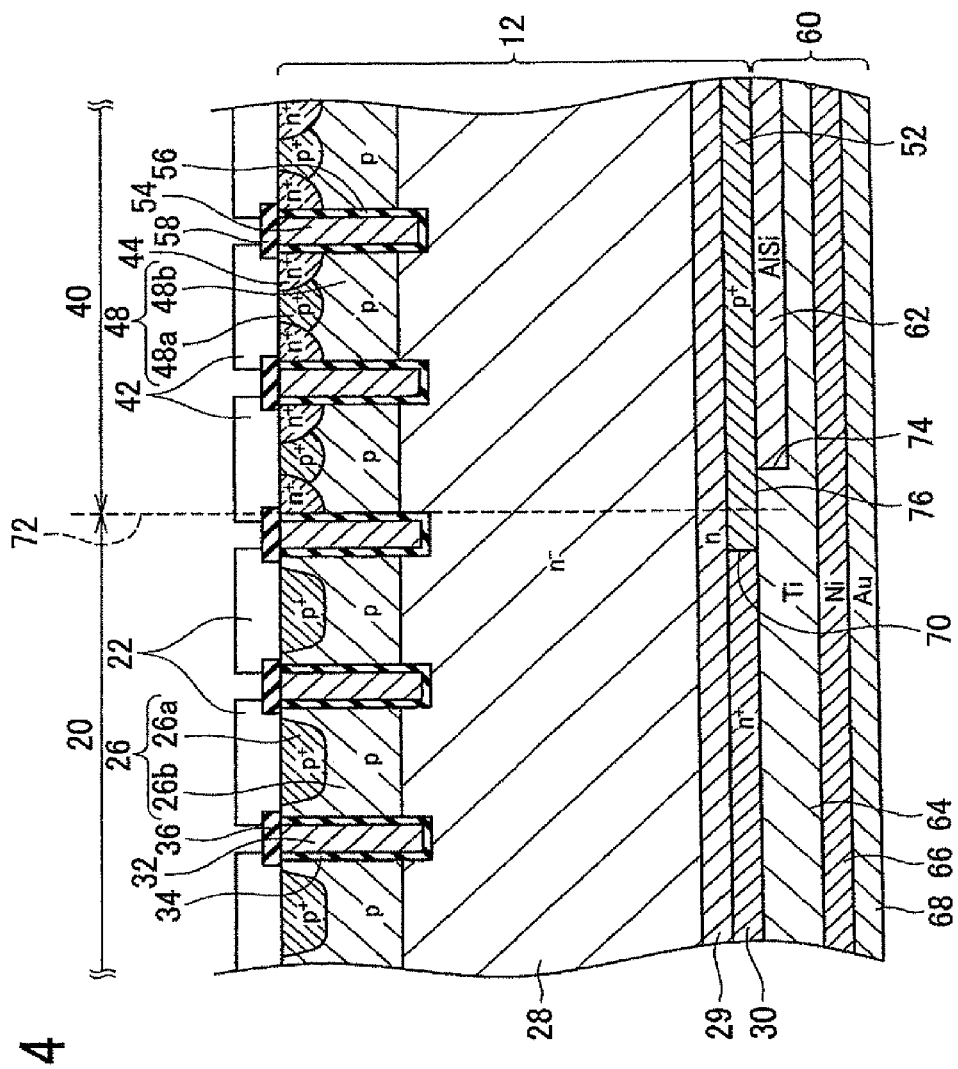
FIG. 4 is a longitudinal sectional view of an RC-IGBT of another modification example.
Figure 5:
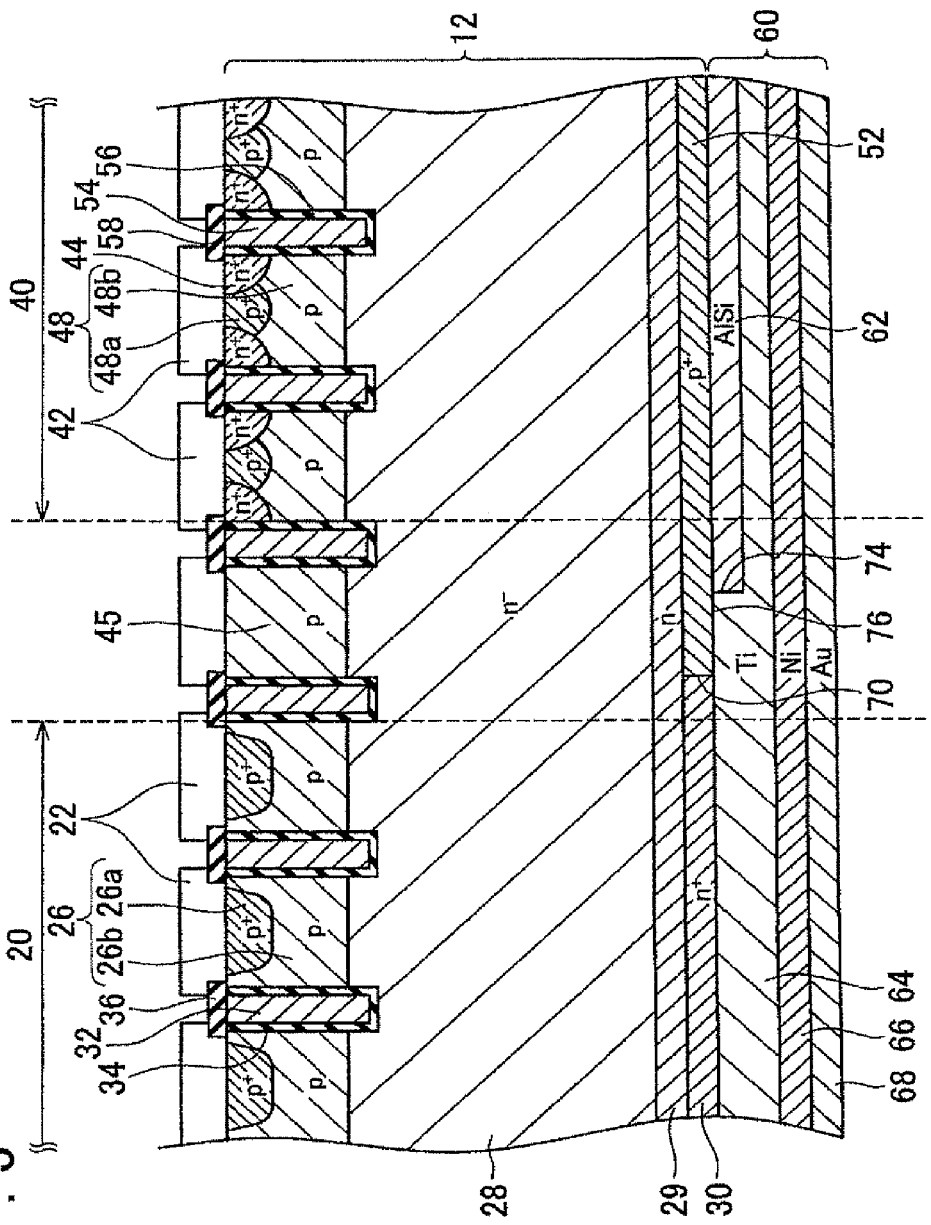
FIG. 5 is a longitudinal sectional view of an RC-IGBT of still another modification example.
Figure 6:
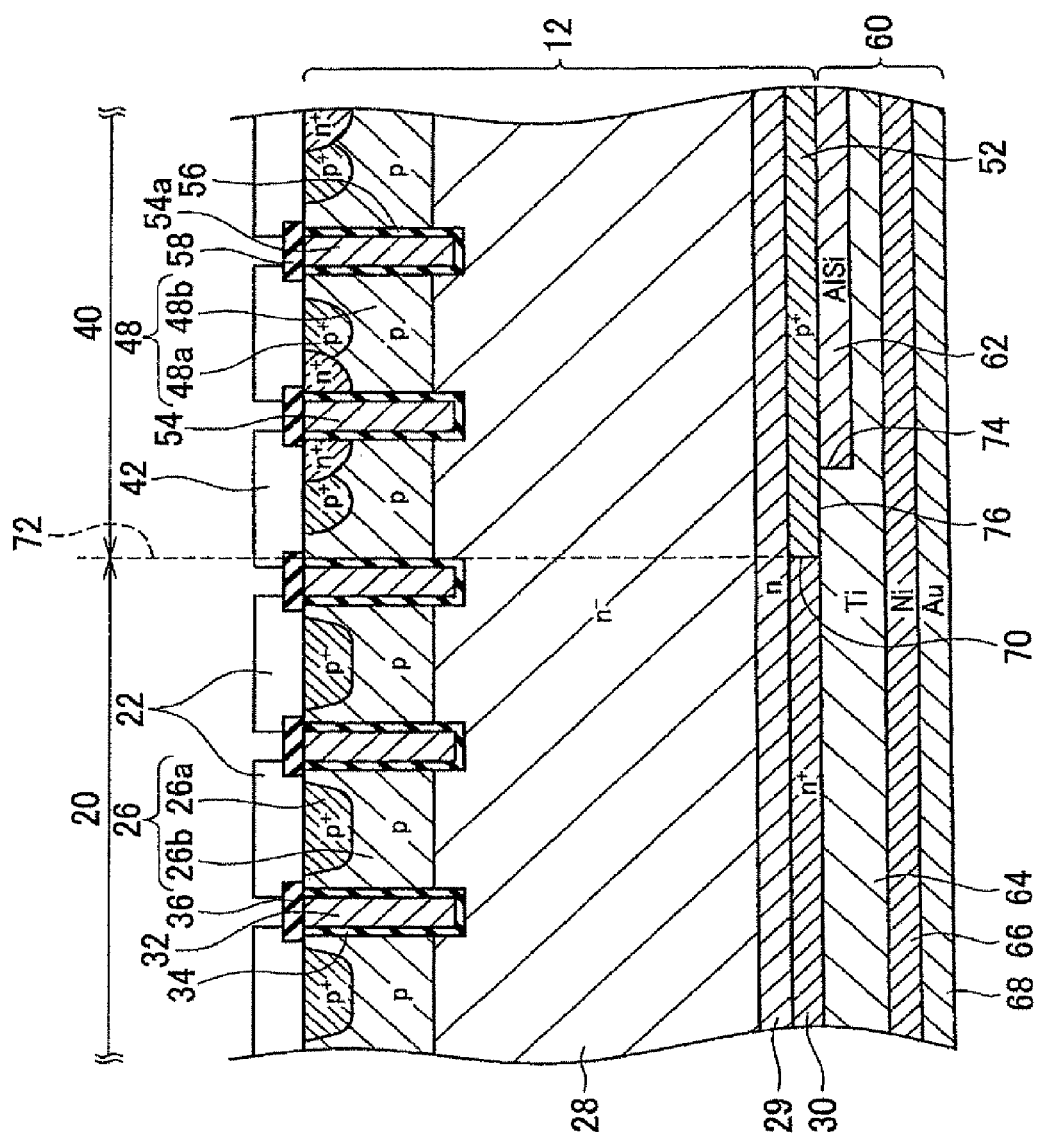
FIG. 6 is a longitudinal sectional view of an RC-IGBT of still another modification example.

Besides, in the foregoing embodiment of the invention, the boundary 72 (i.e., a boundary between the region where the anode regions 26 are formed on the upper face side and the region where the emitter regions 44 and the body regions 48 are formed on the upper face side) substantially coincides in position with the boundary 70. However, there may be established any positional relationship between the upper face-side structure and the lower face-side structure. For example, as shown in FIG. 3, the boundary 72 and the boundary 74 may coincide in position with each other, and the boundary 70 may be present closer to the Ti layer 64 side than the boundary 74. Besides, as shown in FIG. 4, the boundary 72 may be present between the boundary 70 and the boundary 74. Besides, as shown in FIG. 5, there may be a separation region 45 where none of the anode regions 26, the emitter regions 44, and the body regions 48 are formed, on the upper face side of the semiconductor substrate 12. Besides, as shown in FIG. 6, dummy gate electrodes 54a that are not in contact with the emitter regions 44 may be formed in the IGBT region 40. In the cases of FIGS. 5 and 6 as well, there may be established any positional relationship between the upper face-side structure and the lower face-side structure.

Besides, in the foregoing embodiment of the invention, the AlSi layer 62 is formed as the conductor layer that is in contact with the collector layer 52 outside the distance L (i.e., a conductor layer having a large work function). Instead of this layer, however, there may be formed a layer that is made of Au, Be, C, Co, Cu, Fe, Ge, Ir, Mo, Nb, Ni, Os, Pd, Pt, Re, Rh, Se, Te, W, Zn, or an alloy made of some of these elements. Besides, in the foregoing embodiment of the invention, the Ti layer 64 is formed as a conductor layer that is in contact with the collector layer 52 and the cathode layer 30 within the distance L (i.e., a conductor layer having a small work function). Instead of this layer, however, there may be formed a layer that is made of Ag, As, B, Ba, Ca, Cd, Ce, Cs, Eu, Ga, Gd, Hf, In, K, La, Li, Lu, Mg, Mn, Na, Nd, Rb, Sc, Sm, Sn, Sr, Tb, Th, Ti, U, V, Y, Zr, or an alloy made of some of these elements. Incidentally, it is preferable to use a material having a work function equal to or larger than 4.75 eV, as a conductor layer having a large work function. Besides, it is preferable to use a material having a work function equal to or smaller than 4.45 eV, as a conductor layer having a small work function.

Besides, in order to suppress the influence in the case where the respective conductor layers are diffused into the semiconductor substrate, it is preferable to use a material that functions as a p-type impurity in a semiconductor layer, as a conductor layer that is mainly in contact with the p-type collector layer 52 and has a large work function. Besides, it is preferable to use a material that functions as an n-type impurity in a semiconductor layer, in the case where a conductor layer that is in contact with the n-type cathode layer 30 and has a small work function.

What is claimed is:

1. A semiconductor device comprising:
    a semiconductor substrate comprising:
        a drift layer on a buffer layer,
        a diode region having a cathode region, and
        an IGBT region having a collector region,
    wherein the cathode region and collector region are formed under the buffer layer, and wherein the drift layer, the buffer layer, the cathode region and the collector region each comprises different dopant concentrations relative to each other;
    wherein a first conductor layer is in contact with the cathode region, and wherein a second conductor layer is in contact with the collector region is formed on the surface of the semiconductor substrate, and
    a work function of the second conductor layer is larger than a work function of the first conductor layer.

2. The semiconductor device according to claim 1, wherein the cathode region is in contact with the collector region, the first conductor layer is in contact with the second conductor layer, and
    a boundary between the cathode region and the collector region is arranged closer to a cathode region side than a boundary between the first conductor layer and the second conductor layer.

3. The semiconductor device according to claim 1, wherein the work function of the first conductor layer is equal to or smaller than 4.45 eV.

4. The semiconductor device according to claim 1, wherein the work function of the second conductor layer is equal to or larger than 4.75 eV.

* * * * *